(12) United States Patent
Ogino et al.

(10) Patent No.: US 8,632,714 B2
(45) Date of Patent: Jan. 21, 2014

(54) MOLD STRUCTURES, AND METHOD OF TRANSFER OF FINE STRUCTURES

(75) Inventors: Masahiko Ogino, Hitachi (JP); Akihiro Miyauchi, Hitachi (JP); Sigehisa Motowaki, Hitachi (JP); Kosuke Kuwabara, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/526,708

(22) Filed: Jun. 19, 2012

(65) Prior Publication Data
US 2012/0256346 A1 Oct. 11, 2012

Related U.S. Application Data

(62) Division of application No. 10/802,816, filed on Mar. 18, 2004, now abandoned.

(30) Foreign Application Priority Data

Mar. 20, 2003 (JP) .................................. 2003-78460

(51) Int. Cl.
*B28B 11/08* (2006.01)
*B27N 3/18* (2006.01)
*A01J 21/00* (2006.01)

(52) U.S. Cl.
USPC ........... 264/293; 264/299; 264/313; 264/316; 264/319; 264/330; 264/494; 264/496

(58) Field of Classification Search
USPC ......... 264/293, 313, 494, 496, 299, 316, 319, 264/330; 425/440, 436 R
See application file for complete search history.

(56) References Cited

U.S. PATENT DOCUMENTS

| 1,236,304 | A | | 8/1917 | Howell | |
|---|---|---|---|---|---|
| 1,273,131 | A | | 7/1918 | Barrett | |
| 2,201,302 | A | | 5/1940 | Frederick | |
| 4,477,328 | A | * | 10/1984 | Broeksema et al. | 522/181 |
| 5,427,599 | A | * | 6/1995 | Greschner et al. | 65/305 |
| 5,817,242 | A | | 10/1998 | Biebuyck et al. | |
| 5,843,321 | A | | 12/1998 | Kamihara et al. | |
| 6,048,623 | A | | 4/2000 | Everhart et al. | |
| 6,165,391 | A | * | 12/2000 | Vedamuttu | 264/1.33 |
| 6,980,282 | B2 | * | 12/2005 | Choi et al. | 355/72 |
| 6,982,783 | B2 | * | 1/2006 | Choi et al. | 355/72 |

(Continued)

FOREIGN PATENT DOCUMENTS

| JP | 57163536 | A | * | 10/1982 |
| JP | 02113456 | A | * | 4/1990 |

(Continued)

OTHER PUBLICATIONS

Notice of Rejection for corresponding Japanese Appl. No. 2003-078460.

(Continued)

*Primary Examiner* — Atul P. Khare
(74) *Attorney, Agent, or Firm* — Antonelli, Terry, Stout & Kraus, LLP.

(57) ABSTRACT

A mold and a pattern transfer method using the same for a nanoprinting technology. The mold can be released from a substrate accurately and easily. The mold, which is used for forming a fine pattern on a substrate using a press machine, comprises a release mechanism.

3 Claims, 20 Drawing Sheets

(56) References Cited

U.S. PATENT DOCUMENTS

| | | | |
|---|---|---|---|
| 7,019,819 B2* | 3/2006 | Choi et al. | 355/75 |
| 7,296,519 B2* | 11/2007 | Dona et al. | 101/486 |
| 7,323,130 B2* | 1/2008 | Nimmakayala et al. | 264/319 |
| 7,635,263 B2* | 12/2009 | Cherala et al. | 425/385 |
| 8,215,946 B2* | 7/2012 | GanapathiSubramanian et al. | 425/400 |
| 2002/0094496 A1 | 7/2002 | Choi et al. | |
| 2002/0132482 A1 | 9/2002 | Chou | |
| 2004/0009673 A1 | 1/2004 | Sreenivasan et al. | |
| 2010/0062098 A1* | 3/2010 | Ando et al. | 425/385 |

FOREIGN PATENT DOCUMENTS

| | | |
|---|---|---|
| JP | 02-289311 | 11/1990 |
| JP | 02-305612 | 12/1990 |
| JP | 02305612 A | 12/1990 |
| JP | 08-207159 | 8/1996 |
| JP | 9-511710 | 11/1997 |
| JP | 9-511710 A | 11/1997 |
| JP | 2000-194142 | 7/2000 |
| JP | 2002-289560 | 10/2002 |

OTHER PUBLICATIONS

Bender et al., Multiple Imprinting in UV-based Nanoimprint Lithography: Related Material Issues, Microelectronic Engineering, vol. 61-62, 2002, pp. 407-413.

Johnson, Selectively Compliant Orientation Stages for Imprint Lithography, Master of Science in Engineering Thesis, The University of Texas at Austin, May 1999.

Ruchhoeft et al., Patterning Curved Surfaces; Template Generation by Ion Beam Proximity Lithography and Relief Transfer by Step and Flash Imprint Lithography, J. Va. Science Techno. B, vol. 17, No. 6 (Nov./Dec. 1999) pp. 2965-2969.

Huang et al., Reversal Imprinting by Transferring Polymer from Mold to Substrate, J. Vac. Science Tech. B, vol. 20, No. 6, (Nov./Dec. 2002), pp. 2872-2876.

Notice of Rejection for corresponding Japanese Appl. No. 2003-078460 dated Dec. 2, 2008 with full English translation.

Translated abstract of JP 2002-289560.

* cited by examiner

T>Tg

T<Tg

MOLD STRUCTURES, AND METHOD OF TRANSFER OF FINE STRUCTURES

CROSS-REFERENCE TO RELATED APPLICATION

This application is a divisional application of U.S. application Ser. No. 10/802,816, filed Mar. 18, 2004, now abandoned the contents of which are incorporated herein by reference.

BACKGROUND OF THE INVENTION

1. Technical Field

The present invention relates to a nanoprint transfer method for forming a fine structure on a substrate using a mold comprising a heating and a pressure-applying mechanism.

2. Background Art

In recent years, the semiconductor integrated circuits are becoming increasingly finer and more integrated. To cope with such size reductions and increased levels of integration, the accuracy of the photolithography equipment as a pattern transfer technology has been continuously improved. However, the processing method now involves a scale close to that of the wavelength of the photolithographic light source, and the lithography technology is close to its limit. As a result, in order to allow for further reductions in size and achieve higher accuracy, electron beam lithography equipment, which is a type of charged-particle beam equipment, has come to be used more often than photolithography technology.

When patterns are formed using an electron beam, in contrast to the one-shot exposure method whereby an i-line or excimer laser light source is used for forming patterns, a mask pattern is drawn. Accordingly, the electron beam pattern forming method takes more time for exposure (drawing) as the number of patterns to be drawn increases, disadvantageously resulting in increased time for pattern formation. Thus, as the level of integration greatly increases from 256 MB to 1 GB to 4 GB, the time required for pattern formation also increases greatly, possibly resulting in significantly lowered throughput. Thus, in order to reduce time required by the electron beam lithography equipment, development of a one-shot pattern irradiation method is underway whereby masks of various shapes are combined and are irradiated with an electron beam in a single shot, and electron beams of complex shapes are formed. While this allows ever finer patterns to be obtained, it also results in an increase in the size of the electron beam lithography equipment, and it requires a mechanism for controlling mask positions more accurately, thereby increasing equipment cost.

Technologies for carrying out fine pattern formation at low cost are disclosed in U.S. Pat. No. 5,259,926, U.S. Pat. No. 5,772,905 and S. Y. Chou et al., Appl. Phys. Lett., vol. 67, p. 3314 (1995), for example. According to these technologies, a mold having the same concave-convex pattern of as that which is desired to be formed on a substrate is stamped on a resist film layer formed on the surface of the substrate, thereby transferring a predetermined pattern onto the substrate. Particularly, it is described in U.S. Pat. No. 5,772,905 and S. Y. Chou et al., Appl. Phys. Lett., vol. 67, p. 3314 (1995) that the disclosed nanoimprint technique, using a silicon wafer as a mold, can transfer and form fine structures of not more than 25 nanometers.

SUMMARY OF THE INVENTION

However, even with the imprint technique that is supposed to be capable of forming a fine pattern, it is difficult to release a mold from the substrate once the mold has been pressed thereon, with high accuracy and without deforming the fine concave-convex pattern formed on the substrate. For example, when a silicon wafer is used as a mold, the mold could be damaged upon its release.

SPIE'S Microlithography, Santa Clara, Calif., Feb. 27-28, 2001 discloses that a release treatment is provided for the mold that is then mechanically released. In this method, however, the problem of damage to the mold upon release has not yet been solved.

In view of the foregoing, it is the object of the present invention to provide a nanoprint method that is a pattern transfer technique for forming fine structures during the manufacture of semiconductor devices, for example, whereby the mold can be easily and accurately released from the substrate.

The present invention is based on the understanding that one of the reasons preventing the efficient release of the mold is that the arrangement of the substrate and mold is too rigid.

In one aspect, the invention provides a mold for forming a fine structure on a substrate using a press machine. The mold, which is for nanoprinting, is provided with a release mechanism, which facilitates the release of the mold from the substrate.

The invention also provides a nanoprint mold for forming a fine structure on a substrate using a press machine, wherein a portion of a periphery portion of said mold on the side where the concave-convex pattern is formed is inclined such that a center portion of the substrate has a large thickness. By increasing the thickness at the center portion of the mold, the substrate, which is warped during the press process, tries to regain its original state during the release step, creating a stress that facilitates the release of the mold from the substrate. Thus, the mold can be easily released from the substrate at a point where the stress is created.

The invention also provides a nanoprint mold for forming a fine structure on a substrate using a press machine, wherein the mold is flexible. Because the mold is flexible, damage to the mold and/or the substrate that can occur if a local stress is applied between the substrate and the mold during the release step can be prevented.

Preferably, the mold is secured to a supporter via an elastomer. By thus securing the mold to the supporter via an elastomer, the force existing between the substrate and the mold can be made more flexible so that damage to the substrate and/or the mold can be effectively prevented.

Preferably, the supporter comprises a rectangular, square, circular, or elliptical frame structure. By adopting such a frame structure, the mold can be secured to the supporter via the elastomer in a minimal manner, and further a better operability can be obtained during the pattern transfer by a nanoprinting method.

The invention also provides a nanoprint mold for forming a fine structure on a substrate using a press machine, wherein said mold is provided with an elastomer at an edge of the side of said mold on which the concave-convex pattern is formed, said elastomer facilitating the release of said mold from said substrate.

The press machine may comprise a heating and pressing mechanism.

In another aspect, the invention provides a pattern transfer method for forming a fine structure on a substrate using a press machine and a nanoprint mold. A release mechanism is provided in the mold.

For example, the invention provides a pattern transfer method for forming a fine structure on a substrate using a press machine and a nanoprint mold, wherein a portion of a periphery portion of said mold on the side where the concave-convex pattern is formed is inclined such that a center portion of the substrate has a large thickness.

The invention also provides a pattern transfer method for forming a fine structure on a substrate using a press machine and a nanoprint mold having a heating and pressing mechanism, wherein the mold is flexible.

Preferably, the mold is secured to a supporter via an elastomer.

Preferably, the supporter comprises a rectangular, square, circular or elliptical frame structure.

A resin substrate or a resin film on a substrate is preferably molded by either: 1) heating and deforming the resin substrate or the resin film on the substrate; 2) pressing and molding the resin substrate or the resin film on the substrate and then optically curing the resin substrate or the resin film; or 3) optically curing the resin substrate or the resin film on the substrate.

DETAILED DESCRIPTION OF THE PREFERRED EMBODIMENTS

Figure 1:
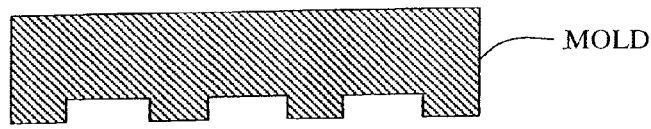
FIG. 1 schematically shows individual steps of a nanoprinting process.
Figure 1:
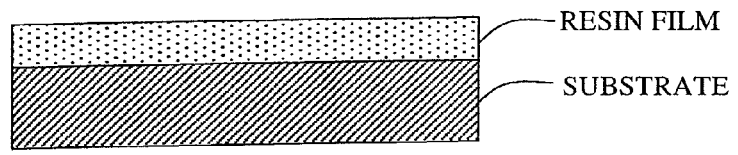
Figure 1:
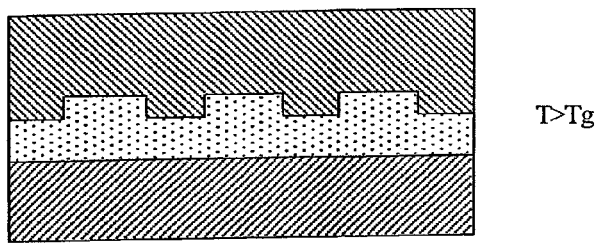
Figure 1:
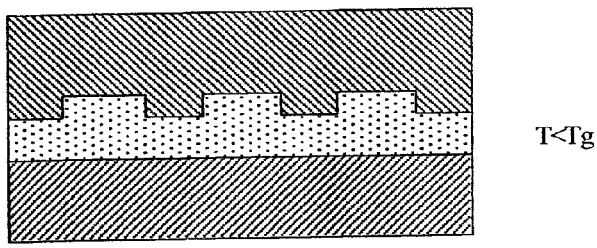

Referring to FIG. 1, the nanoprint method will be described. A mold is produced by forming a fine pattern on the surface of a silicon substrate, for example. On another substrate, there is provided a resin film (FIG. 1(*a*)). Using a press machine, not shown, equipped with a heating and pressing mechanism, the mold is pressed on the resin film at temperature exceeding the glass-transition temperature (Tg) of the resin and at a predetermined pressure (FIG. 1(*b*)). After cooling and hardening (FIG. 1(*c*)), the mold is released from the substrate, transferring the fine pattern of the mold onto the resin film on the substrate (FIG. 1(*d*)). Alternatively, instead of the heat-molding step, a photopolymerizing resin may be used, which can be irradiated with light after molding and cured. Further alternatively, a light-transmitting mold made of glass, for example, may be used, such that the resin can be irradiated with light shone from above the light-transmitting mold after pressing and cured.

The nanoprint method offers various merits. For example: 1) it can transfer extremely fine integrated patterns with high efficiency; 2) it can reduce equipment cost; and 3) it can be used for complex shapes and is capable of forming pillars.

Fields of application of the nanoprint method are many, including: 1) various bio-devices such as DNA chips and immunoassay chips, particularly disposable DNA chips; 2) semiconductor multilayer wiring; 3) printed circuit boards and RF MEMS; 4) optical or magnetic storage; 5) optical devices, such as waveguides, diffraction gratings, microlenses and polarizers, and photonic crystals; 6) sheets; 7) LCD displays; and 8) FED displays. The present invention can be suitably applied to any of these fields.

The term "nanoprint" herein refers to the transfer of patterns or the like measuring several 100 μm to several nm.

While the press machine used in the present invention is not particularly limited, it is preferable to employ a machine equipped with a heating and pressing mechanism and/or a mechanism for shining light from above the light-transmitting mold, from the viewpoint of efficient pattern transfer.

In the invention, the method of forming the fine pattern on the mold that is to be transferred is not particularly limited. For example, photolithography, electron beam lithography, or other techniques may be employed, depending on the desired processing accuracy. The material for the mold may be any material as long as it has a desired strength and a required level of workability, such as silicon wafer, various metal materials, glass, ceramics and plastics. More specifically, examples include Si, SiC, SiN, polycrystalline Si, glass, Ni, Cr, Cu and combinations thereof.

The material for the substrate used in the present invention is not particularly limited, the only requirement being that it has a required strength. Examples include silicon, various metal materials, glass, ceramics and plastics.

The resin film onto which the fine structure is transferred in the invention is not particularly limited and may be selected from a variety of examples depending on the desired processing accuracy. The examples include thermoplastic resins such as: polyethylene, polypropylene, polyvinyl alcohol, polyvinylidene chloride, polyethylene terephthalate, polyvinyl chloride, polystyrene, ABS resin, AS resin, acrylic resin, polyamide, polyacetal, polybutylene terephthalate, glass-reinforced polyethylene terephthalate, polycarbonate, denatured polyphenylene ether, polyphenylene sulfide, polyetheretherketone, liquid crystal polymer, fluororesin, polyarylate, polysulfone, polyethersulfone, polyamide-imide, polyetherimide and thermoplastic polyimide; and thermosetting resins such as phenol resin, melamine resin, urea resin, epoxy resin, unsaturated polyester resin, alkyd resin, silicone resin, diallyl phthalate resin, polyaminobismaleimide and poly-bis-amide-triazole; and materials in which two or more of the above-mentioned materials are blended.

EXAMPLES

Examples of the invention will be hereafter described.

Example 1

Figure 2:
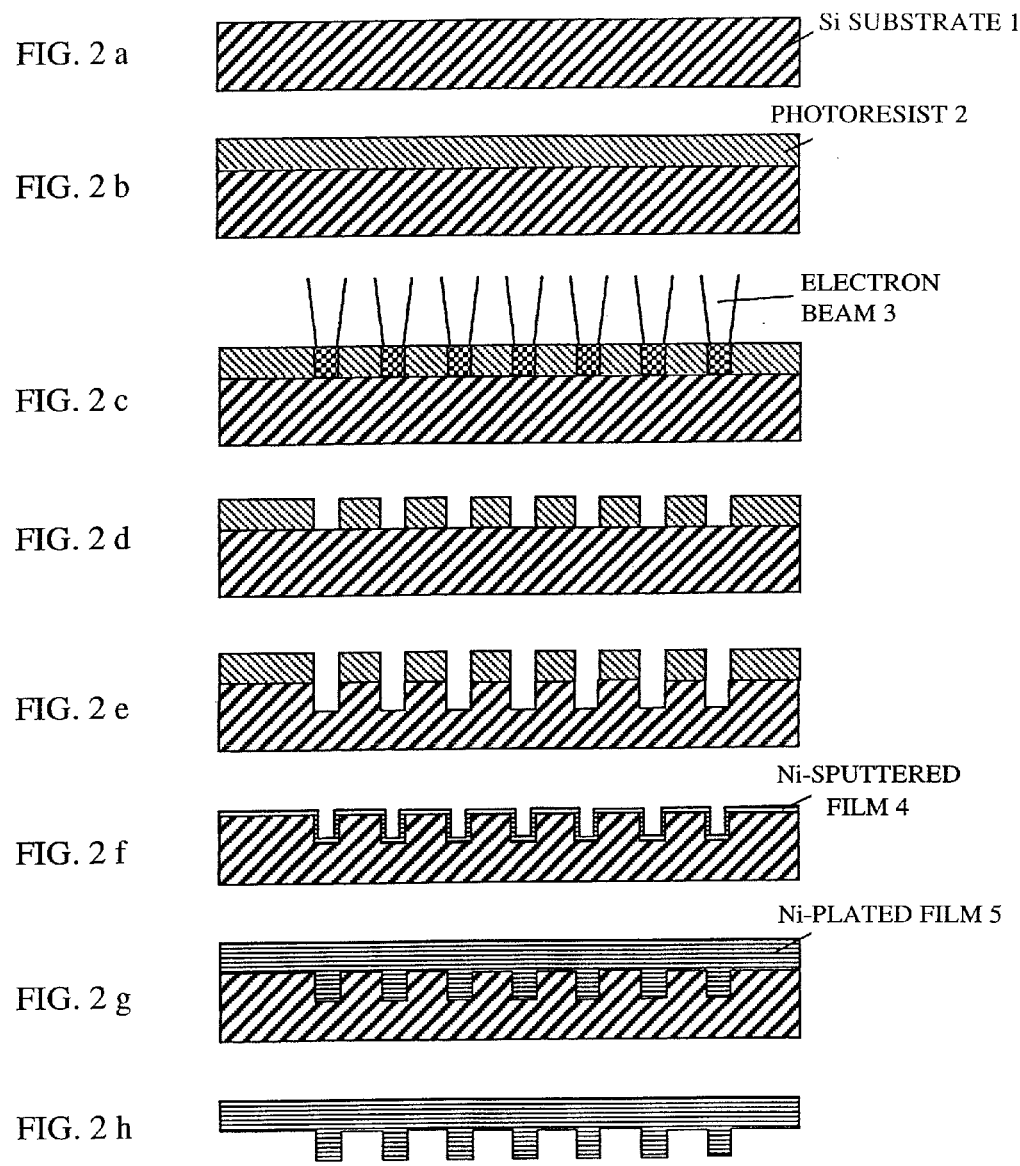
FIG. 2 shows a process of preparing a flexible mold secured to a support frame via an elastomer.
Figure 3:
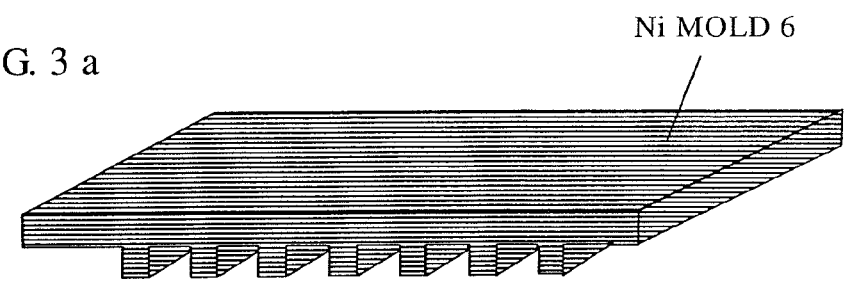
FIG. 3 shows a process of preparing a flexible mold secured to a support frame via an elastomer.
Figure 3:
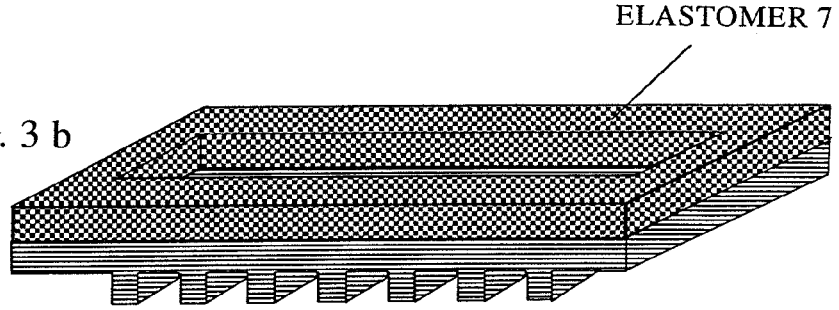
Figure 3:
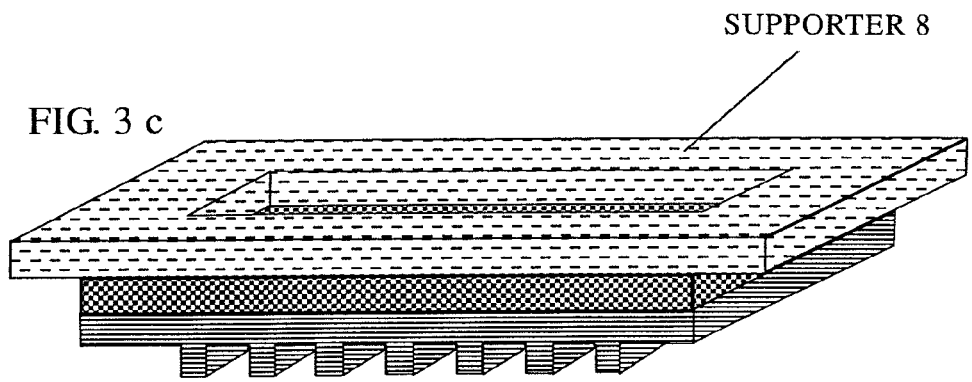

Referring to FIGS. 2 and 3, the method of producing a mold according to an embodiment of the invention will be described, which is flexible and fixed to a support frame via an elastomer. It should be noted that FIGS. 2 and 3 are conceptual diagrams in which pattern shapes are simplified and enlarged. Initially, an Si substrate 1 measuring 100 mm in length×100 mm in width×0.5 mm in thickness was prepared, as shown in FIG. 2(a). Then, a photoresist 2 (OEBR1000, manufactured by Tokyo Ohka Kogyo Co., Ltd.) for electron beam exposure was applied, using a spin coater, as shown in FIG. 2(b). Thereafter, using a JBX6000FS electron beam lithography apparatus (manufactured by Nippon Denshi), a pattern was directly drawn on the photoresist by an electron beam 3, as shown in FIG. 2(c), thus exposing the resist. The photoresist was then developed to obtain convex and concave portions formed on the substrate, as shown in FIG. 2(d). The remaining resist had circular patterns, each with a diameter of 100 nm, arranged in a matrix at a 150 nm pitch. Alternatively, if the pattern is on the order of several 100 nm or more, a Kr laser (wavelength 351 nm) may be used instead of electron beam. Using the concave and convex portions shown in FIG. 2(d) as a mask pattern, the Si substrate 1 was dry-etched such that concave and convex portions were formed in the Si substrate 1 as shown in FIG. 2(e). The resist 2 was then removed by $O_2$ ashing, thereby obtaining a master made of silicon on one surface of which columnar projections with diameters of 100 nm were formed. On the surface of this master was then deposited Ni to a thickness of several 10 nm by sputtering, as shown in FIG. 2(f). This was followed by the formation of an Ni-plated layer to a thickness of 100 μm, as shown in FIG. 2(g). The steps (f) and (g) may alternatively employ electroless plating. Finally, the Si master was released to obtain an Ni mold in which openings with 100 nm diameters were formed in a matrix. This Ni mold was thin and flexible. Because the convex-concave pattern on the Ni mold is reversed from that of the silicon master, the master must be made with a reversed pattern in advance. Alternatively, instead of making the mold directly from the silicon master, the silicon master pattern may be transferred to a sub-master and then an Ni mold may be made from the sub-master.

FIG. 3(a) is a perspective view of an Ni mold 6 formed by the above-described method. A elastomer 7 made of silicone rubber with a hollow center and a thickness of 1 mm was affixed to the back surface of the mold 6, using a silicone adhesive (KE1820, manufactured by Shin-Etsu Silicones), as shown in FIG. 3(b). Further, a supporter 8 made of a SUS frame was affixed, as shown in FIG. 3(c), thereby obtaining the mold according to the invention. The elastomer 7 and supporter 8 may be formed in various shapes in accordance with the shape of the mold, such as square, rectangular, circular or elliptical shapes.

Figure 4:
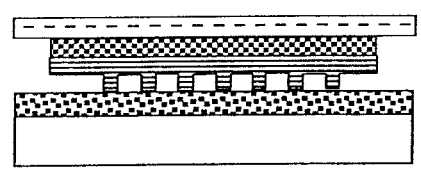
FIG. 4 shows a nanoprinting process utilizing a mold according to the invention.
Figure 4:
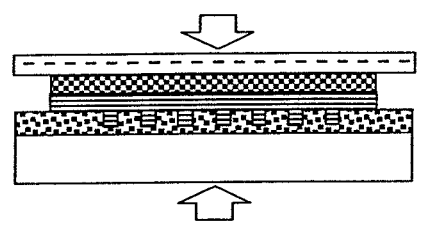
Figure 4:
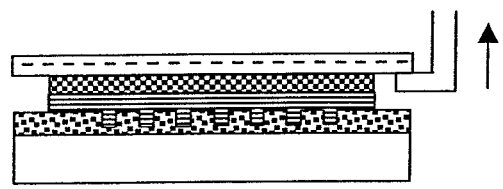
Figure 4:
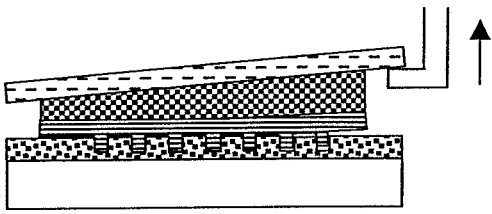
Figure 4:
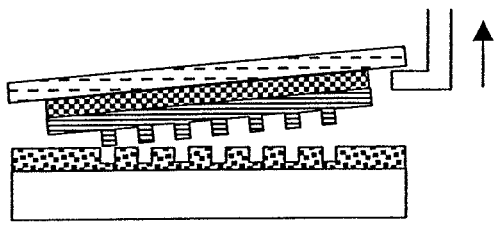

Now referring to FIG. 4, the nanostamping process using the mold of the invention will be described. FIG. 4(a) shows the mold, which is bonded to the SUS frame via resilient material, having been set on an Si substrate on which a 10 weight-percent diethylene glycol monoethyl ether acetate solution of polystyrene 679 (manufactured by A & M Styrene Co., Ltd.) was spin-coated. The pressure is then reduced to 0.1 Torr or less, and the mold is heated to 250° C. and maintained under the pressure of 12 MPa, as shown in FIG. 4(b) for 10 minutes, thus deforming the polystyrene. Thereafter, the mold was allowed to stand to cool to temperature of less than 100° C., and then exposed to the atmosphere. This was followed by a releasing step which, if the conventional releasing method had been utilized, would have required a large force to release the mold from the substrate because of the mesh between the mold and substrate via nanoscale irregularities, and would have likely damaged the mold. In accordance with the invention, a hook was attached to one end of the support frame, as shown in FIG. 4(c), and the support frame was raised using the hook. As a result, the elastomer extended in a direction along its thickness, as shown in FIG. 4(d), thereby exerting a force on the Ni portion to release it from the resin. Because of the release-start point provided at the edge of the mold, the releasing process proceeded smoothly, as shown in FIG. 4(e). The support frame tended to break off or become damaged upon application of force in the releasing direction in the absence of the resilient material and with the Ni portion directly fixed to the support frame. However, in accordance with the mold structure of the invention, the mold can be released without being damaged because of the provision of the elastomer.

Example 2

Figure 5:
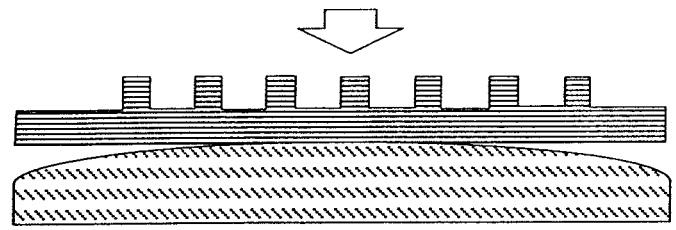
FIG. 5 shows a process of preparing a curved-surface mold.
Figure 5:
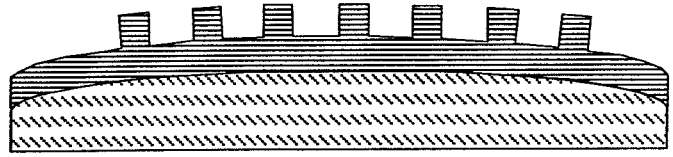
Figure 6:
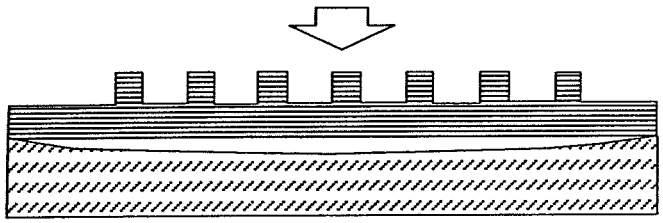
FIG. 6 shows a process of preparing a curved-surface mold.
Figure 6:
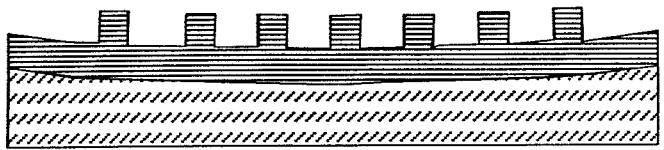
Figure 7:
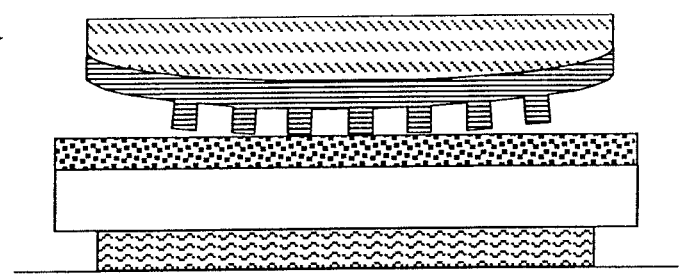
FIG. 7 shows a process of preparing a curved-surface mold.
Figure 7:
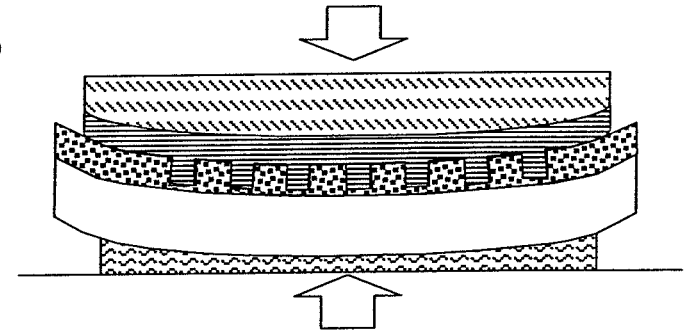
Figure 7:
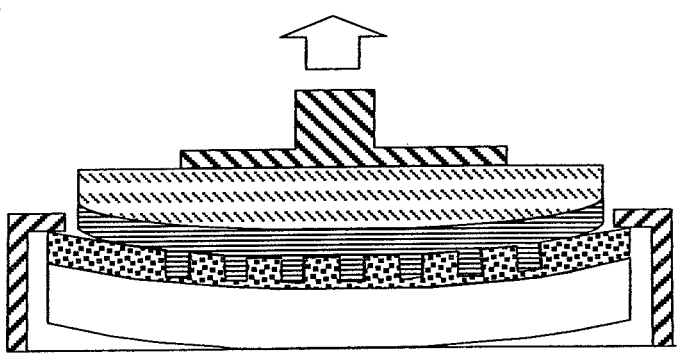

Referring to FIGS. 5 to 7, a method of producing a curved mold according to another embodiment of the invention will be described.

The Ni mold (6 inches, 100 μm in thickness) produced by the above-described process was bonded to an SUS (6 inches, with a thickness of 1 cm at the center and 7 mm at the edges) using a silicone adhesive (KE1820, manufactured by Shin-Etsu Silicones), and a pressure was exerted thereon (FIG. 5(a)), thereby obtaining a convex mold (FIG. 5(b)). It is possible to form a concave mold in a similar manner (FIG. 6).

Alternatively, it is possible to make a curved mold by performing Au 20-nm sputtering on a concave mold, conducting Ni electroplating until the center portion has a thickness of approximately 1 cm, and then releasing the deposited mold from the concave mold. Further, it is also possible to produce a concave mold by providing Ni plating on a convex mold in a similar manner.

Hereafter, the stamping process using a convex mold will be described by referring to FIG. 7. A 10% diethylene glycol monoethyl ether acetate solution of a 500-nm thickness polystyrene 679 (manufactured by A & M Styrene Co., Ltd.) was applied to a 5-inch Φ Si substrate with a 0.5-mm thickness. A 4-inch Φ buffer material with a 3 mm thickness was placed beneath, as shown in FIG. 7(a). The pressure was reduced to 0.1 Torr or less, and the mold was heated to 250° C. and pressed at 12 MPa for 10 minutes. The mold was then allowed to stand to cool to temperatures 100° C. or less, when it was exposed to the atmosphere (FIG. 7(b)). When the sample was taken out and the buffer material was removed, the warped substrate tended to regain its original shape and, as a result, the edge portions were easily released. When the edge portions were fixed by a jig and the mold was lifted up vertically at the rate of 0.1 mm/s (FIG. 7(c)). The mold was easily released.

Example 3

Figure 8:
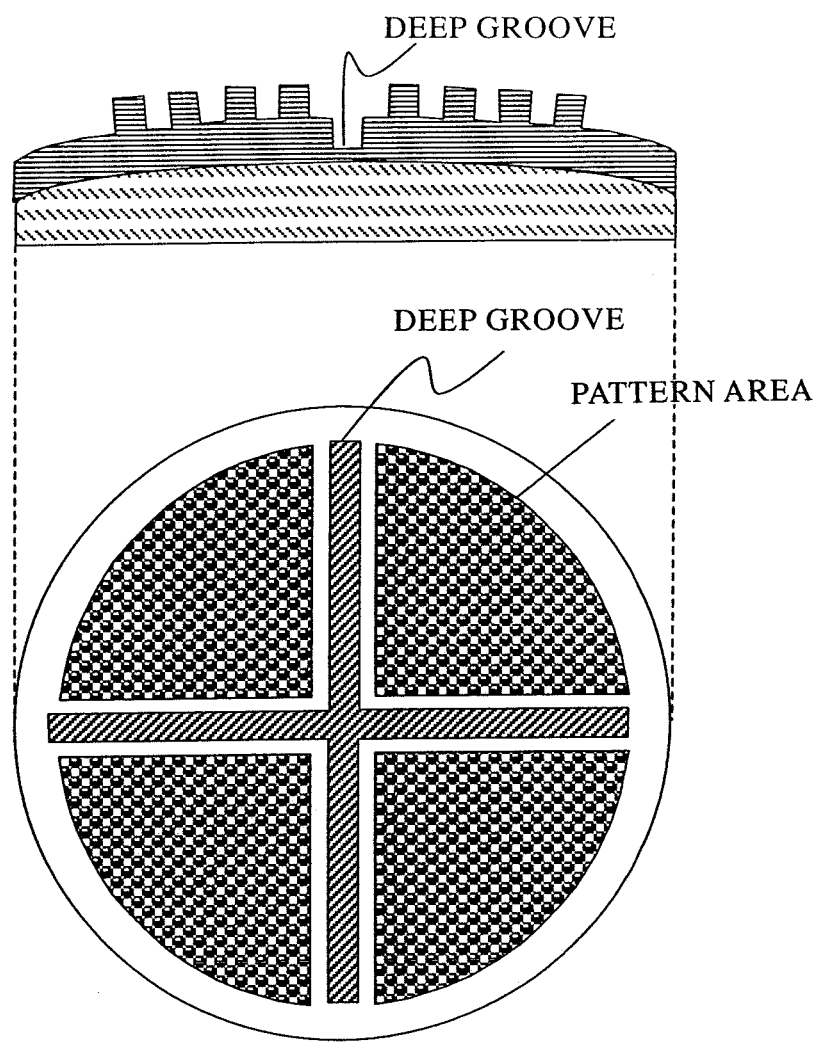
FIG. 8 shows a convex-surface mold having a deep groove.
Figure 9:
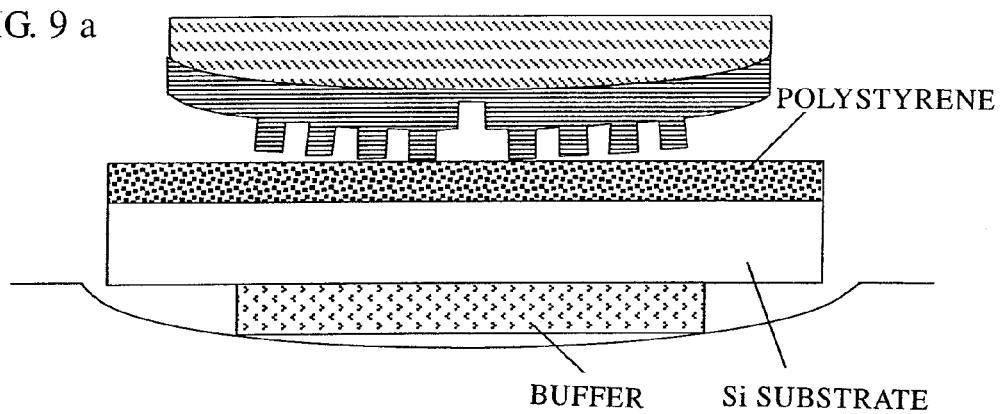
FIG. 9 shows a process of molding with the convex-surface mold with deep groove.
Figure 9:
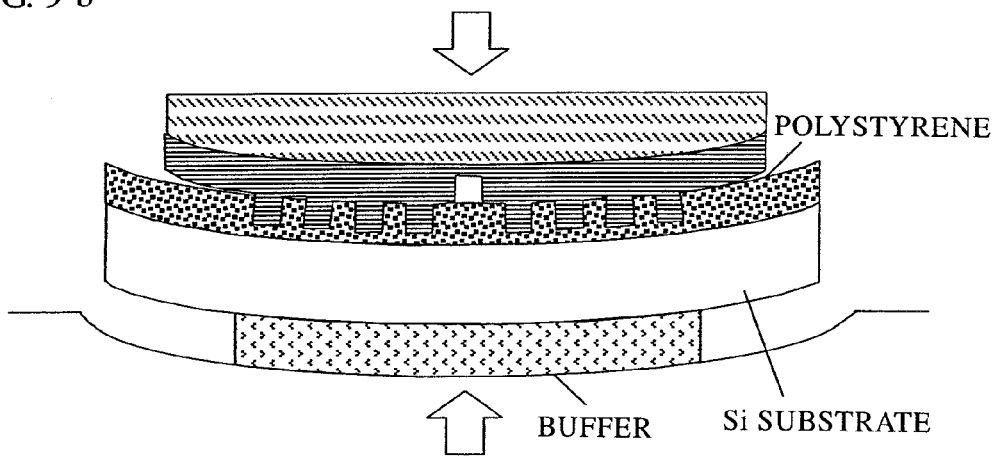
Figure 9:
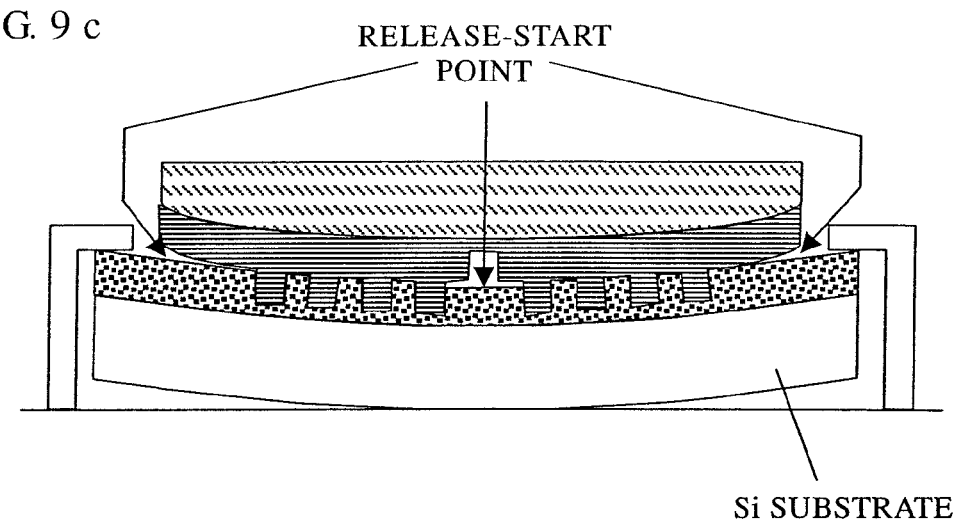

A method of producing a mold with a curved surface in which a deep groove is formed according to another embodiment of the invention will be described by referring to FIGS. 8 to 10.

A cross-shaped pattern with a width of 10 μm and a depth of 3 μm was formed in advance at the center of a Ni mold (6 inches, 100 μm in thickness). The mold was then bonded to an SUS (6 inches, with a thickness of 1 cm at the center and 7 mm at the edges), with a silicone adhesive (KE1820, manufactured by Shin-Etsu Silicones), thereby obtaining a deep-grooved convex mold (FIG. 8).

A stamping process was carried out using the above-described convex-curved mold with the deep groove. A 10% diethylene glycol monoethyl ether acetate solution of polystyrene 679 (manufactured by A & M Styrene Co., Ltd.) was applied to a 5-inch Φ Si substrate with a thickness of 0.5 mm, to a thickness of 500 nm. A 4-inch Φ buffer material of a thickness of 3 mm was then placed underneath. The base of the press machine had been formed to have a concave-curved surface in advance (FIG. 9(a)). The pressure was then reduced to 0.1 Torr or less, and the mold was heated to 250° C. and then pressed at 12 MPa for 10 minutes. As a result, the substrate was smoothly bent in conformity with the curvature of the base (FIG. 9(b)). The mold was then allowed to stand to cool to temperature of 100° C. or less when it was exposed to the atmosphere. The sample was then put out and the buffer material was removed. As the warped substrate tended to regain its original shape, the edge portions of the substrate were released by themselves. Further, air was introduced to the deep groove at the center of the substrate where another release-start point was provided. With the edge portions of the substrate secured by a jig, the mold was lifted vertically at the rate of 0.1 mm/s (FIG. 9(c)). The mold was easily released.

Figure 10:
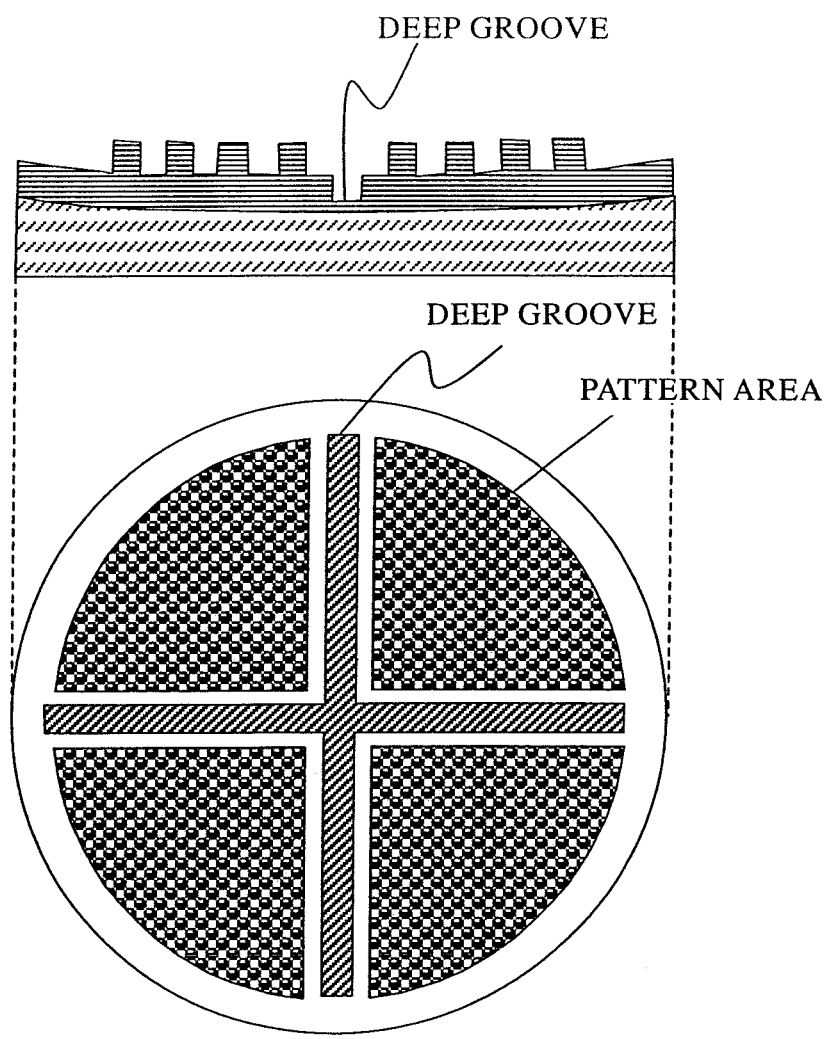
FIG. 10 shows a concave-surface mold having a deep groove.

Similar effects were obtained with a concave-curved mold with a deep groove as shown in FIG. 10.

Example 4

Figure 11:
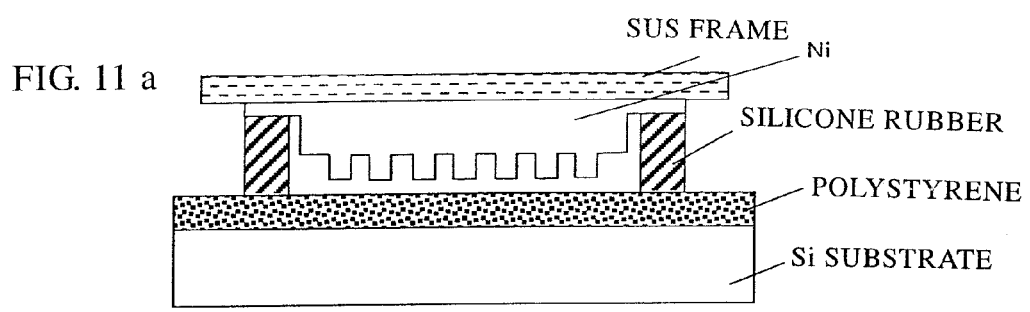
FIG. 11 shows a process of preparing a mold provided with an elastomer at an edge thereof.
Figure 11:
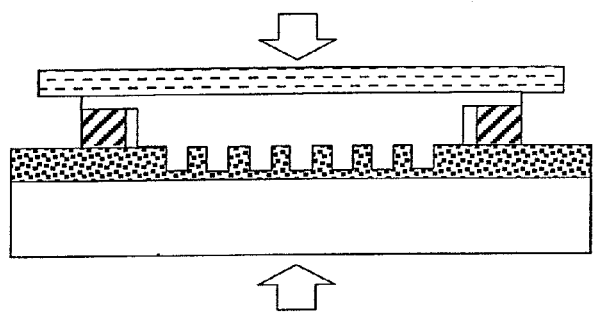
Figure 11:
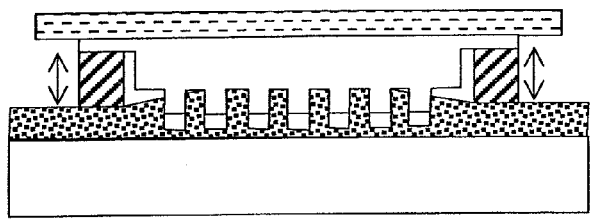

A method of producing a mold with elastic edges according to another embodiment of the invention will be described by referring to FIGS. 11 and 12.

A stepped Ni mold (4-inch Φ, with a 1-cm band portion at the periphery measuring 1 mm in thickness, a pattern-formed portion measuring 5 mm in thickness, and a pattern measuring 300 nm in depth) was affixed to an SUS frame (6-inch Φ; 1 mm in thickness), using a silicone adhesive (KE1820, Shin-Etsu Silicones). A silicone rubber member (6 mm square in cross section) was affixed to the periphery of the mold using the aforementioned adhesive.

A 10% diethylene glycol monoethyl ether acetate solution of polystyrene 679 (manufactured by A & M Styrenes) was applied to a 5-inch Φ Si substrate with a 0.5 mm thickness to a thickness of 500 nm (FIG. 11(a)). The pressure was then reduced to 0.1 Torr or less, and the mold was heated to 250° C. and pressed at 12 MPa for 10 minutes, thus compressing the silicone rubber. The mold was then allowed to stand to cool, and exposed to the atmosphere at 100° C. or less (FIG. 11(b)). When the molding pressure was removed, the compressed silicone rubber, in an attempt to regain its original shape, exerted a force in a releasing direction such that a release-start point existed at the edge of the mold. With the Si substrate vacuum-sucked, the mold was lifted vertically at the rate of 0.1 mm/s (FIG. 11(c)). The mold was easily released.

Figure 12:
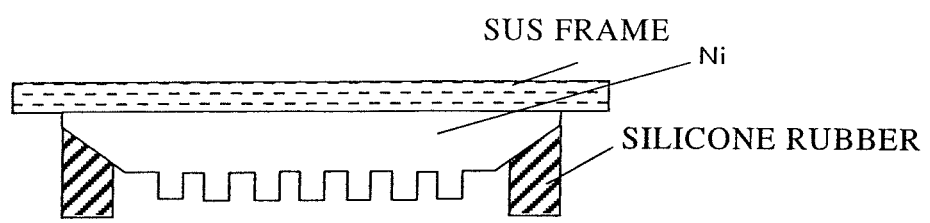
FIG. 12 shows a process of preparing a mold provided with an elastomer at an edge thereof.

Similar effects were obtained when an elastomer was affixed to a Ni mold provided with a tapered edge, as shown in FIG. 12.

Example 5

Figure 13:
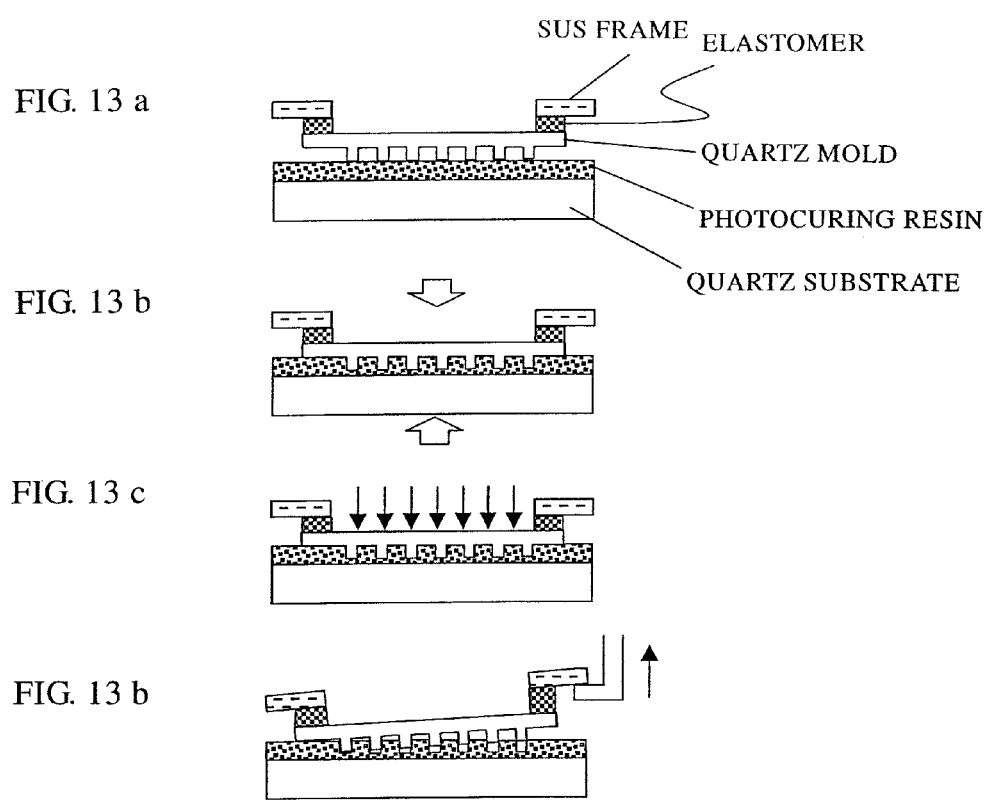
FIG. 13 shows a process of molding with a light-transmitting, flexible mold that is secured to a support frame via an elastomer.

Referring to FIG. 13, a molding process using a flexible, light-transmitting mold secured to a support frame via an elastomer according to another embodiment of the invention will be described.

A silicone rubber member as an elastomer with a hollow center and with a thickness of 1 mm was affixed to a quartz mold (VIOSIL: manufactured by Shin-Etsu Chemical Co., Ltd., 5-inch Φ and 6.35 mm in thickness) using a silicone adhesive (KE1820, manufactured by Shin-Etsu Silicones). An SUS frame was further affixed as a supporter. A photosetting resin (SCR701, manufactured by JSR) was spin-coated on a quartz substrate (VIOSIL: Shin-Etsu Chemical Co., Ltd., 5-inch Φ and 6.35 mm in thickness), to a thickness of 500 nm (FIG. 13(a)). Then, the pressure was reduced to 0.1 Torr or less, and the mold was pressed at 0.5 MPa for 10 minutes without heating (FIG. 13(b)). Then, the resin was irradiated with a UV light at 100 mJ/cm$^2$ (FIG. 13(c)). After the mold was exposed to the atmosphere, a hook was attached to the SUS frame and the frame was lifted using the hook. The elastomer extended, and a stress was concentrated at the edge of the mold, which became a release-start point allowing a smooth release of the mold (FIG. 13(d)).

Examples of the Application of the Invention

Hereafter, several fields to which the nanoprinting technique using the mold with a release-mechanism according to the invention can be suitably applied will be described.

Example 6

Bio (Immuno) Chip

Figure 14:
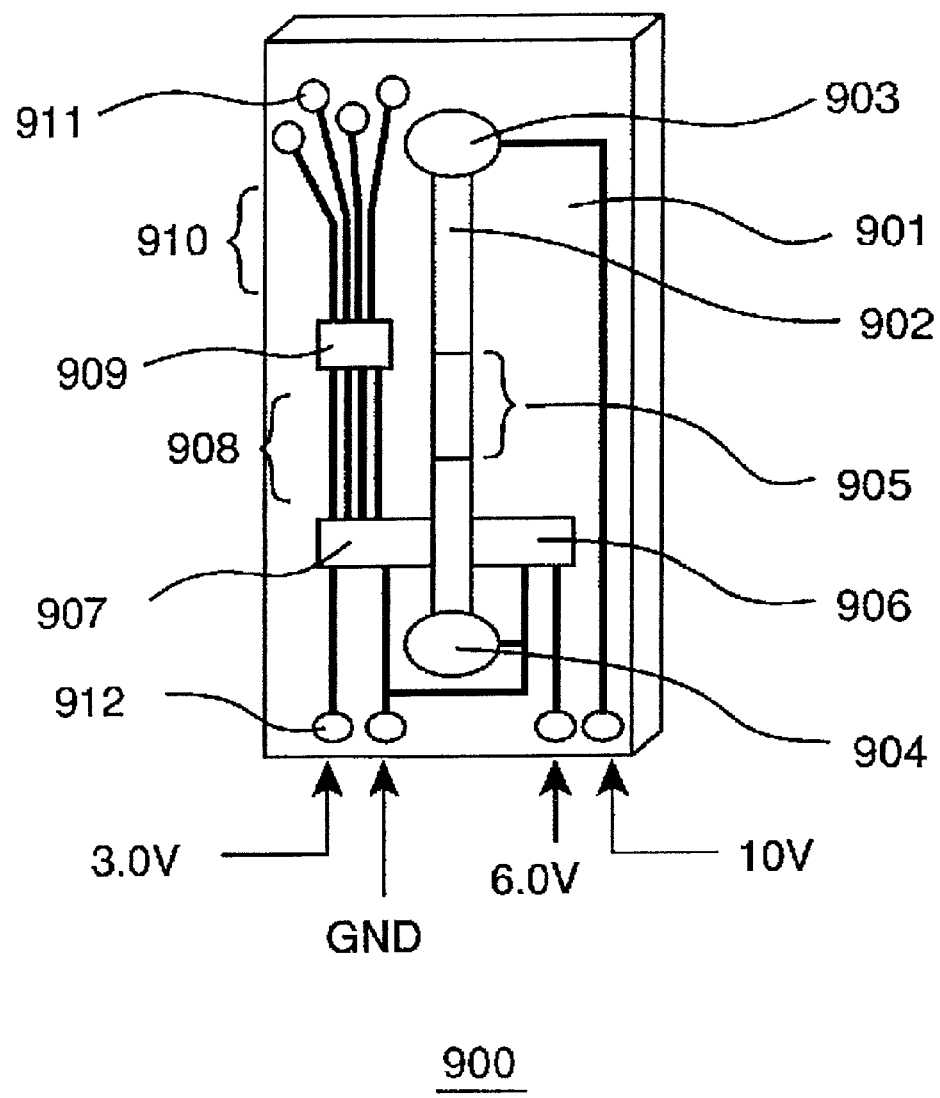
FIG. 14 schematically shows a biochip.

FIG. 14 schematically shows a biochip 900. In a substrate 901 made of glass is formed a flow passage 902 with a depth of 3 μm and a width of 20 μm. A specimen containing DNA (deoxyribonucleic acid), blood, protein and the like is introduced via an inlet 903 and is caused to flow in the flow passage 902 until it reaches an outlet 904. A molecular filter 905 is disposed in the flow passage 902. In the molecular filter 905, there is formed a projection assembly 100 measuring 250 to 300 nm in diameter and 3 μm in height.

Figure 15:
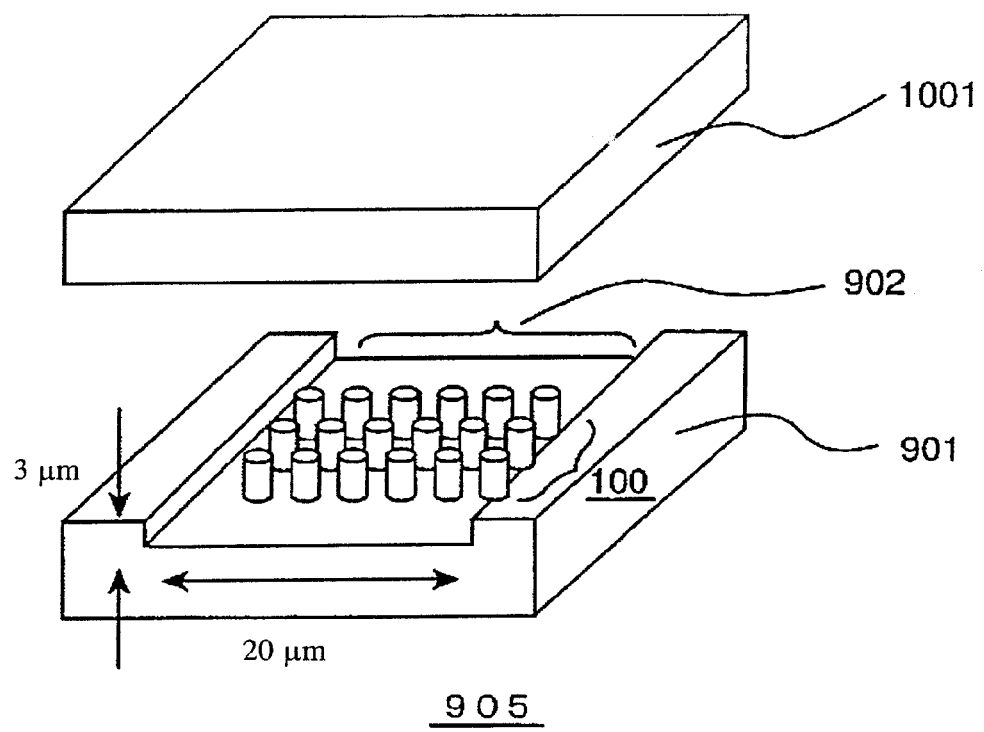
FIG. 15 is a cross-sectional perspective view of the biochip near where a molecular filter is formed.

FIG. 15 is a cross-sectional perspective view of the biochip 905 near where the molecular filter 905 is formed. The projection assembly 100 is formed in a part of the flow passage 902 formed on the substrate 901. The substrate 901 is covered with an upper substrate 1001 so that the specimen flows inside the flow passage 902. In the case of a DNA chain-length analysis, while a specimen containing DNA is electrophoresed in the flow passage 902, DNA is separated by the molecular filter 905 depending on the chain length of the DNA with high resolution. The specimen that has passed through the molecular filter 905 is irradiated with a laser light emitted by a semiconductor laser 906 mounted on the surface of the substrate 901. When the DNA passes, the light incident on a photodetector 907 is reduced by about 4%, so that the chain length of DNA in the specimen can be analyzed based on an output signal from the photodetector 907. The signal detected in the photodetector 907 is fed to a signal processing chip 909 via a signal line 908. To the signal processing chip 909 is connected another signal line 910, which is also connected to an output pad 911 for connection with an external terminal. Power is supplied to individual components via a power supply pad 912 provided on the surface of the substrate 901.

Figure 16:
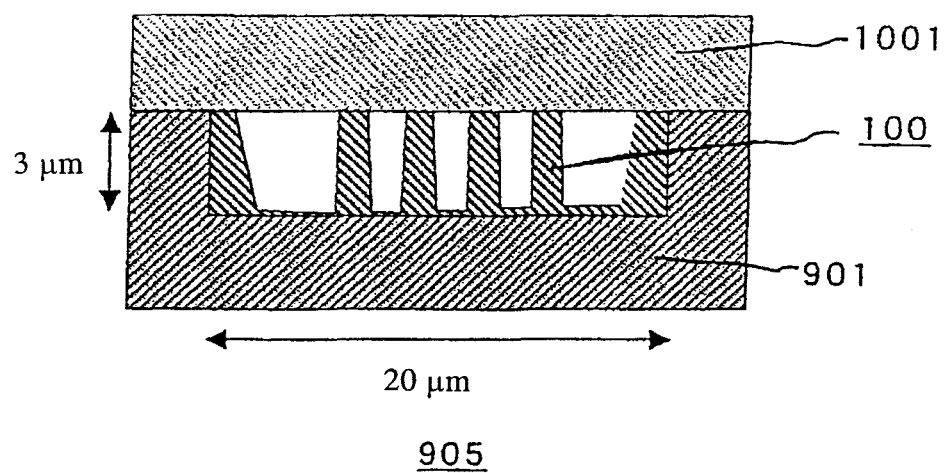
FIG. 16 is a cross section of the molecular filter.

FIG. 16 shows a cross section of the molecular filter 905 which, according to the present embodiment, comprises a substrate 901 with a concave portion, a plurality of projections formed on the concave portion of the substrate 901, and an upper substrate 1001 formed to cover the concave portion. The projections are formed such that their tips are in contact with the upper substrate. The projection assembly 100 is mainly made of an organic material and can therefore be deformed. Thus, the projection assembly 100 is not subject to damage when the upper substrate 1001 is mounted over the flow passage 902. The upper substrate 1001, therefore, can be placed in contact with the projection assembly 100. In this arrangement, highly sensitive analysis can be performed without the specimen being leaked from the gap between the projections and the upper substrate 1001. When a chain-length analysis of DNA was actually conducted, it was learned that while the half-value width of resolution of the base pairs was 10 base pairs in the case of the projection assembly 100 made of glass, it was possible to improved the half-value width of resolution of the base pairs to 3 base pairs in the case of the projection assembly 100 made of an organic material. While the molecular filter in the present embodiment has a structure such that the projections are in contact with the upper substrate, a film made of the same material as that of the projections may be formed on the upper substrate such that the projections are in contact with the film. In this way, better contact can be obtained.

While in the present embodiment there is only one flow passage 902, a plurality of flow passages 902 in which projections of different sizes are disposed may be provided. In this way, different kinds of analysis can be performed simultaneously.

While in the present embodiment DNA was examined as specimen, a particular sugar chain, protein or antigen may be analyzed by modifying the surface of the projection assembly 100 in advance with a molecule that reacts with the sugar chain, protein or antigen. By thus modifying the surface of the projections with an antibody, improvements can be made in the sensitivity of immunoassay.

By applying the invention to a biochip, a projection for the analysis of organic materials with nanoscale diameters can be simply formed. Further, by controlling the shapes of the concave and convex portions on the mold surface or the viscosity of the organic material thin film, the position, diameter and/or height of the projection made of organic material can be controlled. Thus, in accordance with the invention, there can be provided a microchip for high-sensitivity analysis.

Example 7

Multilayered Wiring Board

Figure 17:
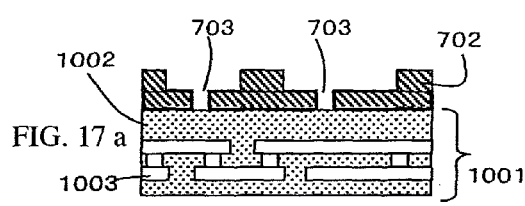
FIG. 17 shows the individual steps of a process of preparing a multilayer wiring board.
Figure 17:
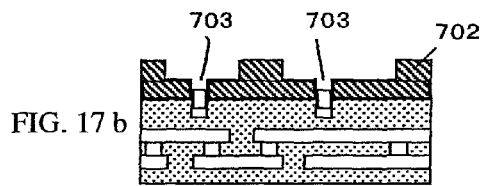
Figure 17:
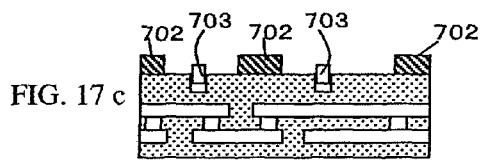
Figure 17:
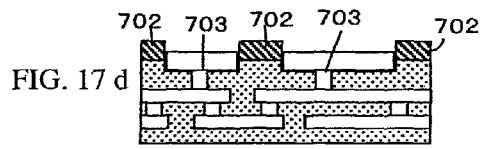
Figure 17:
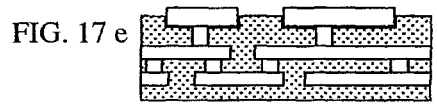
Figure 17:
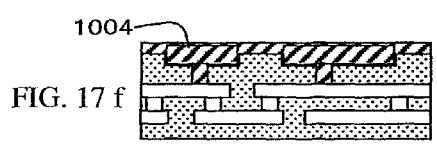
Figure 17:
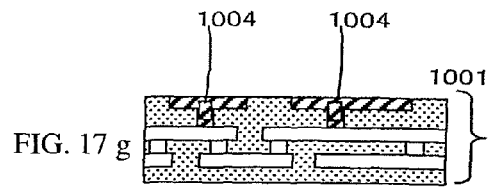
Figure 17:
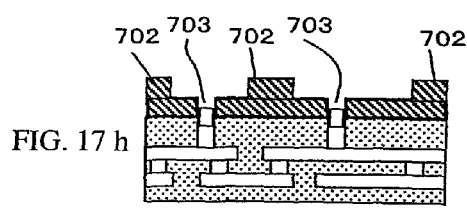
Figure 17:
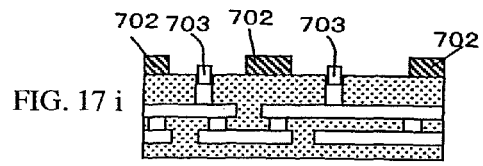
Figure 17:
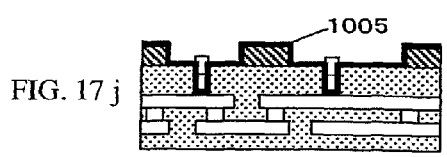
Figure 17:
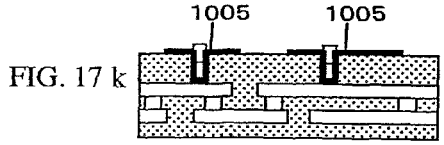
Figure 17:
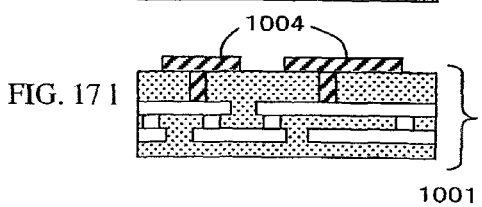

FIG. 17 shows the process of making a multilayered wiring board. After a resist 702 is formed on the surface of a multilayer wiring board 1001 comprising a silicon oxide film 1002 and copper wiring 1003, as shown in FIG. 17(*a*), a pattern transfer process is carried out using a mold (not shown). Exposed regions 703 on the multilayer wiring board 1001 are then dry-etched using $CF_4/H_2$ gas. As a result, the exposed regions 703 on the surface of the multilayer wiring board 1001 are processed in the shape of grooves, as shown in FIG. 17(*b*). The resist 702 is then resist-etched by RIE to thereby remove the resist at the lower-step portions, so that the exposed regions 703 are enlarged, as shown in FIG. 17(*c*). Thereafter, the exposed regions 703 are dry-etched until the previously formed grooves reach the copper wiring 1003, thereby obtaining a structure as shown in FIG. 17(*d*). The resist 702 is then removed to obtain the multilayer wiring board 1001 having a grooved surface, as shown in FIG. 17(*e*). On the surface of the multilayer wiring board 1001 is then formed a metal film by sputtering (not shown), followed by electroplating, thereby forming a metal-plated film 1004 as shown in FIG. 17(*f*). The metal-plated film 1004 is then polished until the silicon oxide film 1002 on the multilayer wiring board 1001 is exposed, thus obtaining the multilayer wiring board 1001 with metal wiring formed on the surface thereof, as shown in FIG. 17(*g*).

Another process for making a multilayer wiring board will be hereafter described. Upon dry-etching of the exposed regions 703 in the state shown in FIG. 17(*a*), by etching until the copper wiring 1003 inside the multilayer wiring board 1001 is reached, the structure shown in FIG. 17(*h*) is obtained. The resist 702 is then etched by RIE to remove the resist on the lower-step portions, thereby obtaining the structure shown in FIG. 17(*i*). Thereafter, a metal film 1005 is formed on the surface of the multilayer wiring board 1001 by sputtering, so that the structure shown in FIG. 17(*j*) is obtained. The resist 702 is then lifted and removed, thereby obtaining the structure shown in FIG. 17(*k*). By conducting electroless plating using the remaining metal film 1005, the multilayer wiring board 1001 can be obtained with the structure shown in FIG. 17(*l*).

By applying the invention to a multilayer wiring board, wires can be formed with high dimensional accuracy.

Example 8

Magnetic Disc

Figure 18:
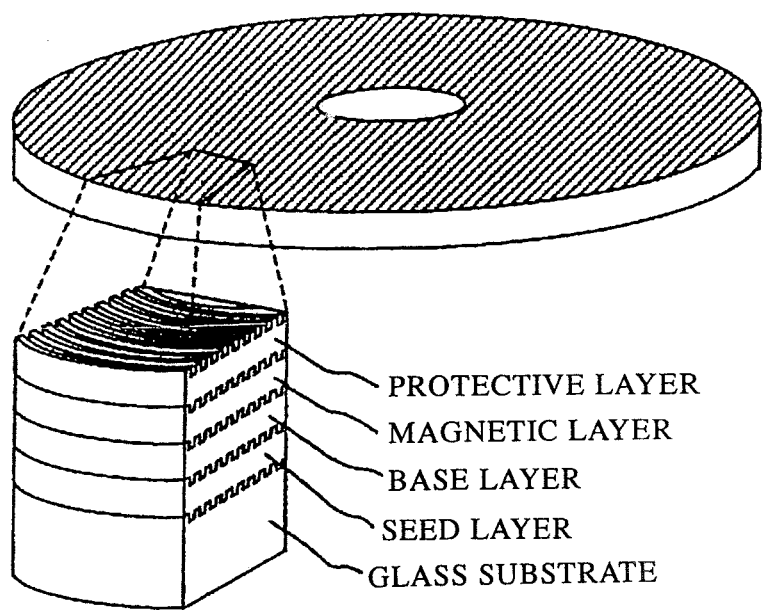
FIG. 18 is an overall view of a magnetic recording medium, with a portion thereof enlarged and shown in cross section.
Figure 19:
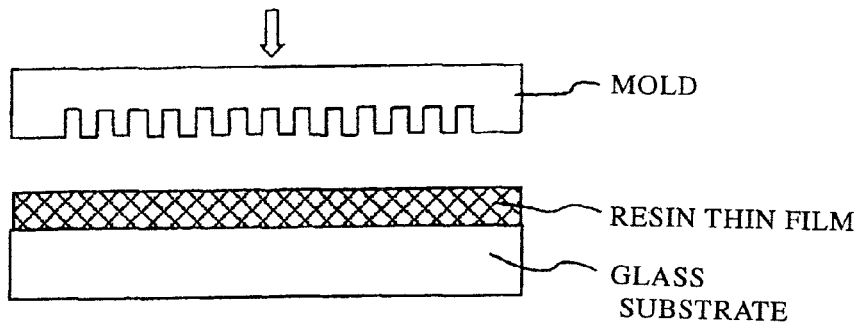
FIG. 19 illustrates a method of forming a concave-convex pattern on glass by a nanoprinting method, showing cross-sectional views of the glass taken along the radius thereof.
Figure 19:
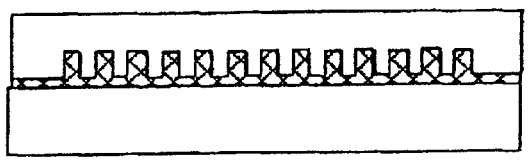
Figure 19:
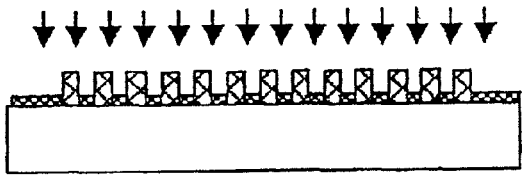
Figure 19:
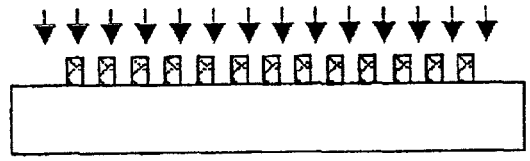
Figure 19:
Figure 19:
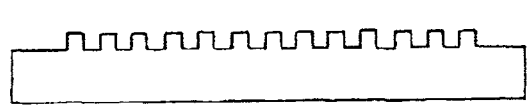

FIG. 18 shows an overall view of a magnetic recording medium according to Example 8, with a portion enlarged and shown in cross section. The substrate is made of glass having fine concave and convex portions. On the substrate are formed a seed layer, a base layer, a magnetic layer, and a protective layer. Now referring to FIG. 19, the method of manufacturing a magnetic recording medium according to the present example will be described. FIG. 19 shows a radial cross section of the substrate, illustrating a method of forming concave and convex portions on the glass by a nanoprinting method. First, a glass substrate is prepared. A soda lime glass was used in the present example. The material of the substrate is not particularly limited, with the only requirement being that it can be formed as sheets. Examples include other glass materials such as aluminosilicate glass, and metal materials such as Al. Then, a resin film was formed to a thickness of 200 nm using a spin coater, as shown in FIG. 19(*a*). The resin was PMMA (polymethyl methacrylate).

For the mold, a Si wafer was prepared in which grooves were formed concentrically with the opening at the center of the magnetic recording medium. The grooves measured 88 nm in width and 200 nm in depth, and the pitch between the grooves was 110 nm. The convex and concave portions of the mold, which were very fine, were formed by photolithography using an electron beam. After heating the mold to 250° C. to reduce the viscosity of the resin, as shown in FIG. 19(*b*), the mold was pressed. When the mold was released at a temperature below the glass-transition point of glass, a reversed concave-convex pattern to the pattern on the mold was obtained, as shown in FIG. 19(*c*). Thus, using the nanoprinting method, a pattern can be formed that is finer than visible light wavelength and beyond the dimensional limit of exposure by conventional photolithography. Further, by removing the remaining film at the bottom of the resin pattern by dry etching, a pattern as shown in FIG. 19(*d*) can be formed. By further etching the substrate with hydrofluoric acid using this resin film as a mask, the substrate can be processed as shown in FIG. 19(*e*). By removing the resin with a remover, grooves with a width of 110 nm and a depth of 150 nm were formed, as shown in FIG. 19(*f*). Thereafter, a seed layer made of NiP was formed on the glass substrate by electroless plating. In the conventional magnetic discs, the NiP layer is formed to a thickness of 10 µm or more. In the present embodiment, the thickness of the NiP layer was limited to 100 nm in order to reflect the fine concave and convex shapes formed on the glass substrate onto the upper layer. Further, a Cr base layer of 15 nm, a CoCrPt magnetic layer of 14 nm, and a C protective layer of 10 nm were successively formed by a sputtering method generally employed in forming magnetic recording media, thereby preparing the magnetic recording medium according to the present embodiment. In this magnetic recording medium, the magnetic substance was radially isolated by a non-magnetic layer wall with a width of 88 nm. Thus, a higher longitudinal magnetic anisotropy was obtained. While the formation of concentric patterns using a polishing tape (texturing) is known in the art, it can only offer a pattern pitch on the order of microns and is therefore not suitable for high-density recording media. In the magnetic recording medium of the present embodiment, on the other hand, magnetic anisotropy was ensured by forming a fine pattern by the nanoprinting method, and a high-density recording of 400 GB per square inch was achieved. The nanoprinting pattern formation technique is not limited to the circumferential direction, but it can also be used for radially forming a non-magnetic isolating wall. Further, the effect of the present embodiment whereby the magnetic anisotropy is provided is not particularly limited by the materials used in the seed layer, base layer, magnetic layer or protective layer.

Example 9

Optical Waveguide

Another example will be described in which an optical device with varying directions of propagation of incident light is applied to an optical information processing apparatus.

Figure 20:
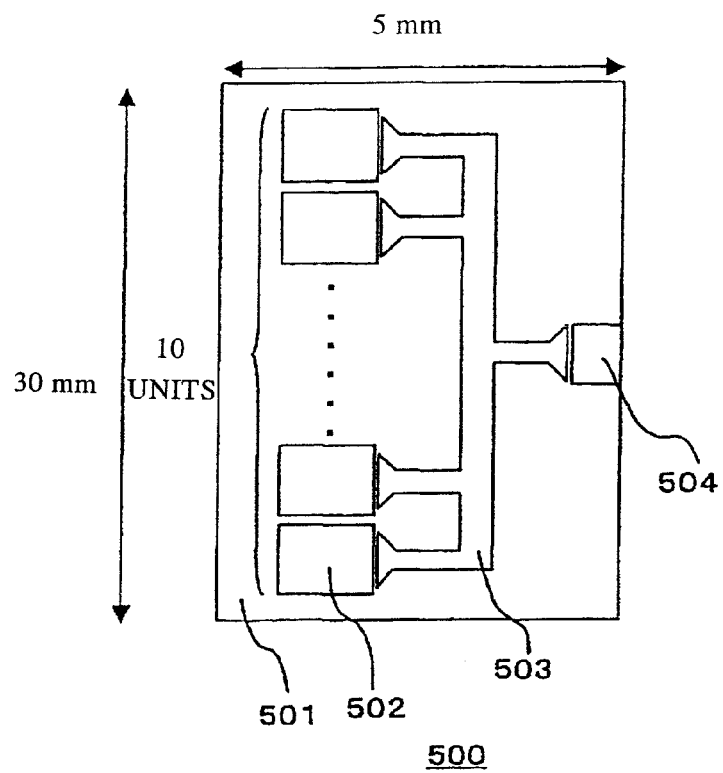
FIG. 20 schematically shows an optical circuit 500.

FIG. 20 schematically shows the structure of an optical circuit 500 that was prepared. The optical circuit 500 comprised a substrate 501 of aluminum nitride, measuring 30 mm in length, 5 mm in width and 1 mm in thickness. On the substrate 501 were formed ten transmission units 502 each consisting of an InP semiconductor laser and a driver circuit, an optical waveguide 503 and an optical connector 504. The ten semiconductor lasers have different transmission wavelengths varying at 50 nm intervals. The optical circuit 500 is a basic component in optical multiplex communication system devices.

Figure 21:
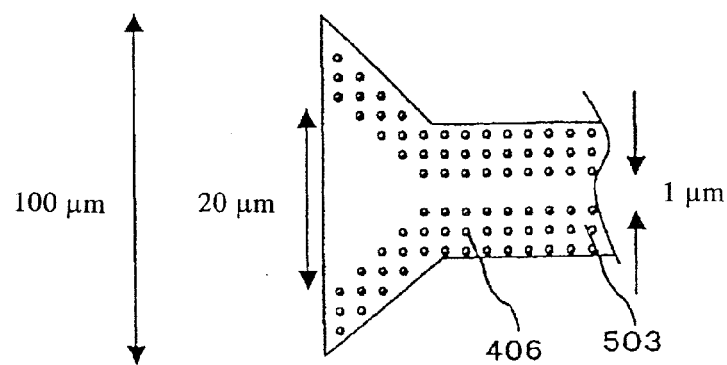
FIG. 21 schematically shows the layout of projections in an optical waveguide.

FIG. 21 schematically shows the layout of projections 406 inside the optical waveguide 503. In order to allow for an alignment error between the transmission unit 502 and the optical waveguide 503, the optical waveguide 503 was formed to be wider toward the end that had a width of 20 µm. Thus, the waveguide had a structure such that a signal light was guided into a region with a width of 1 µm by a photonic bandgap. While the projections 406 were arranged at 0.5 µm intervals in the actual device, the projections 406 in FIG. 21 are shown in a simplified manner and fewer of them are shown than actually existed.

In the optical circuit 500, the directions of propagation of light can be varied when ten different wavelengths of signal light are superposed and outputted, so that the width of the circuit can be greatly reduced, to 5 mm in the example. Thus, the size of the optical communication device can be reduced. The projections 406 can be formed by the pressing of a mold, and manufacturing cost can be reduced. While the present example relates to a device in which input light is superposed, it should be obvious that the optical waveguide 503 can be usefully applied to all optical devices for controlling an optical path.

By applying the present invention to optical waveguides, the direction of propagation of light can be varied by causing a signal light to propagate in a structure where projections made of an organic material as a principal component are periodically arranged. The projections can be formed by a simple manufacturing technique involving the pressing of a mold, such that an optical device can be manufactured at low cost.

In accordance with the invention, a release mechanism is provided in a nanoprint mold by, in particular, increasing the thickness of a center portion of the mold. By so doing, the substrate is warped during the pressing step and then tries to regain its original state as the mold is released in the release step, creating a stress causing the substrate and mold to separate from each other. Thus, the release of the mold from the substrate is facilitated at a point where the stress exists. Further, in accordance with the invention, a flexible mold is employed such that the damage to the substrate and/or the mold that could result if a local stress is applied between them during the releasing of the mold can be prevented. In accordance with the invention, additionally, a spring mechanism is provided between the mold and the substrate whereby the release of the mold from the substrate is facilitated during the release step.

What is claimed is:

1. A pattern transfer method comprising the steps of:
positioning a substrate, while in an original flat state and having a resin film formed thereon, onto a flat, solid buffer material positioned on a curved press machine base;
pressing a stamper having a curved surface at a side on which a concave-convex pattern is formed onto the resin film to transfer said concave-convex pattern onto the resin film while smoothly warping the positioned substrate from said original flat state along the curved surface of the stamper and into conformity with the curvature of the base;
removing the buffer material from the warped substrate; and
lifting the stamper from the warped substrate and patterned resin after removing the buffer material and after release-start points are initially formed as a result of a force exerted by the substrate as the substrate returns from the warped state to said original flat state.

2. The pattern transfer method according to claim 1, wherein the stamper comprises a deep groove that is deeper than the concave-convex pattern, and wherein the deep groove penetrates the stamper from one side surface thereof to another side surface thereof.

3. The pattern transfer method according to claim 1, wherein the curved surface of the stamper is convex, and wherein the curve of the curved base is concave.

* * * * *